United States Patent [19]
Mochizuki et al.

[11] Patent Number: 6,094,701
[45] Date of Patent: Jul. 25, 2000

[54] SEMICONDUCTOR MEMORY DEVICE

[75] Inventors: Yoshio Mochizuki; Hideo Kato, both of Kawasaki, Japan

[73] Assignee: Kabushiki Kaisha Toshiba, Kawasaki, Japan

[21] Appl. No.: 09/099,841

[22] Filed: Jun. 19, 1998

[30] Foreign Application Priority Data

Jun. 24, 1997 [JP] Japan .................................. 9-167280

[51] Int. Cl.$^7$ .................................................. G06F 12/02
[52] U.S. Cl. ............................ 711/5; 711/103; 711/169;
711/173; 711/217; 711/218; 711/219; 365/189.02;
365/230.03; 365/230.04; 365/230.05; 365/230.08;
365/230.09
[58] Field of Search ................................ 711/5, 103, 153,
711/169, 173, 217, 218, 219; 365/189.02,
230.03, 230.04, 230.05, 230.08, 230.09

[56] References Cited

U.S. PATENT DOCUMENTS 5,257,235  10/1993  Miyamoto ........................ 365/230.03
5,297,029   3/1994  Nakai et al. .
5,532,970   7/1996  Butler et al. ...................... 365/230.05

*Primary Examiner*—Hiep T. Nguyen
*Attorney, Agent, or Firm*—Hogan & Hartson LLP

[57] ABSTRACT

A semiconductor memory device is provided with a determination circuit and an address adder. The determination circuit determines whether a read start address selects upper-address banks B5–B8 or lower-address banks B1–B4. When the determination circuit determines that the lower-address banks are selected, the address adder increments a column address by 1. From the upper-address banks, data are read from the columns corresponding to the read start address. From the lower-address banks, data are read from the columns that are next to the columns corresponding to the read start address. Even when the upper-address banks are designated by the read start address, the data output from the lower-address banks corresponds to the next columns. Since there is no busy time during data output, successive access is enabled and the access cycle time can be as short as possible.

13 Claims, 10 Drawing Sheets

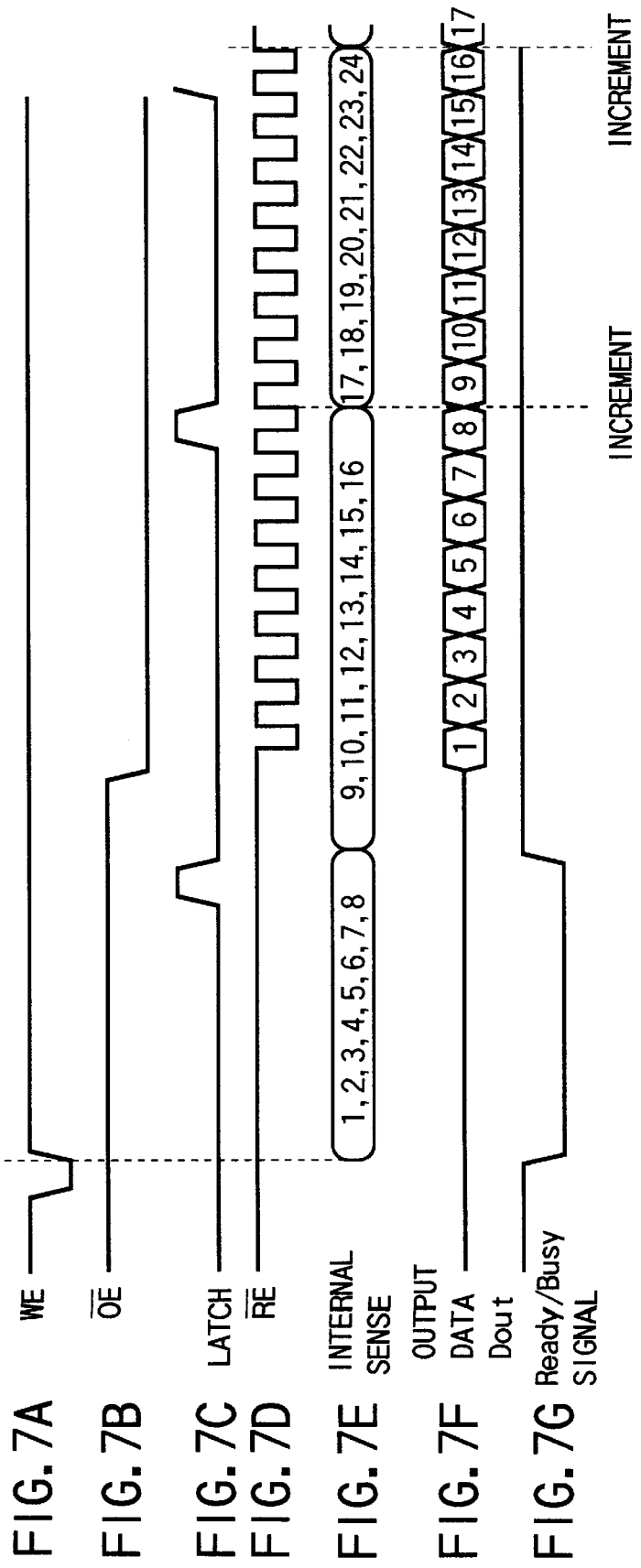

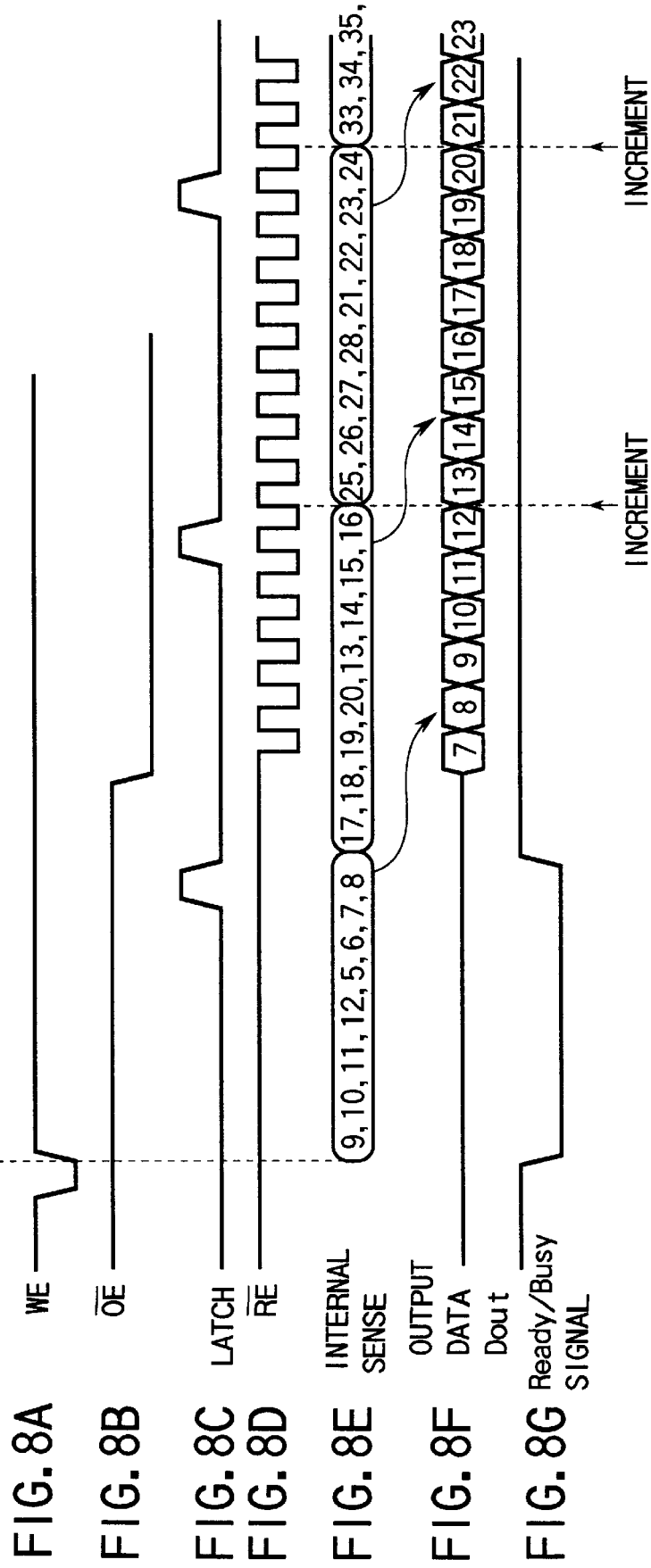

SEMICONDUCTOR MEMORY DEVICE

BACKGROUND OF THE INVENTION

The present invention relates to a semiconductor memory device which sequentially reads out data from a plurality of banks. More specifically, the invention relates to a serial-access ROM which incorporates an address counter for sequentially generating addresses, and which starts sequentially outputting data in synchronism with serial-access clocks when a read start address is set in the address counter.

In general, the access time of a ROM is long. In the case of a serial-access ROM, the serial cycle time is shortened by grouping the memory cell arrays into a plurality of banks and providing sense amplifiers for the respective banks. Data read out from the banks are sensed and amplified at a time, and the resultant data are sequentially output from a single output buffer.

A conventional serial-access type semiconductor memory device, which sequentially reads out data from a plurality of banks, has a problem when an upper-address bank is designated by a read start address. To be specific, a busy period when serial access is impossible is produced between a first-cycle data read operation and a second-cycle data read operation, and the access cycle time is lengthened thereby.

BRIEF SUMMARY OF THE INVENTION

The present invention has been made in consideration of the above circumstances, and an object of the invention is to provide a semiconductor memory device which enables serial access even when an upper-address bank is designated by a read start address, and which therefore realizes a short access cycle time.

A semiconductor memory device comprising: first and second memory cell arrays each of which has a plurality of banks and in which memory cells are arranged in a matrix pattern; a column address generation circuit, supplied with a read start address, for generating a column address which sequentially counts up from the read start address; a bank selection circuit for selecting the banks on the basis of an upper bit of the column address generated by the column address generation circuit; a determination circuit for determining which memory cell array includes a bank of a designated memory cell; an address adder circuit, operating when the determination circuit determines that the second memory cell array includes the bank of the designated memory cell, for adding "1" to a lower bit of a column address which is generated by the column address generation circuit and which are supplied to the first memory cell array; a first column selection circuit for selecting memory cell columns of the banks of the first memory cell array on the basis of a lower bit of the column address generated by the column address generation circuit when the determination circuit determines that the first memory cell array includes the bank of the memory cell designated by the read start address, and for selecting memory cell columns of the banks of the first memory cell array on the basis of a "1"-incremented column address output from the address adder circuit when the determination circuit determines that the second memory cell array includes the bank of the memory cell designated by the read start address; a second column selection circuit for selecting memory cell columns of the banks of the second memory cell array on the basis of the lower bit of the column address generated by the column address generation circuit; a sense amplifier circuit for amplifying data read out from the memory cells in units of one bank; a latch circuit for latching the data which are read out from the memory cells and which are amplified by the sense amplifier circuit in units of one bank; and an output circuit for sequentially outputting the data latched in the latch circuit, beginning with data corresponding to a bank selected by the bank selection circuit.

A primary object of the present invention is to shorten the access cycle time required. To attain this object, the invention causes the determination circuit to determine which memory cell array, the first or second memory cell array, includes the bank selected by the read start address. When it is determined that the second memory cell array includes the bank selected by the read start address, a lower address of the column address generated by the column address generation circuit is incremented by "1" by the address adder circuit, and data is read out from the memory cell corresponding to the "1"-incremented column address. Accordingly, no busy period is produced after the output circuit starts data output. In addition, serial access is enabled even when an upper-address bank is designated by the read start address.

Another object of the present invention is to provide a semiconductor memory device with which the miniaturization and high integration of memory cells can be coped with, by adopting a two-stage decoding system, i.e., by designing the first and second column selection circuit such that each is made up of two decoders and two column gates. A high-speed operation is also intended by adopting a decoder wherein the number of transistors connected in series is small.

A further object of the present invention is to provide a semiconductor memory device whose determination circuit is made up of a minimum number of elements and occupies the smallest possible pattern area. To be specific, the determination circuit is made of a register which latches one bit of a read start address, and a bank from which a read operation is started is determined by checking the latched bit to see whether it is at the "H" level or the "L" level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 7A to 7G are timing charts illustrating signals from and to the circuits shown in FIGS. 1 through 6;

FIGS. 8A to 8G are timing charts illustrating signals from and to the circuits shown in FIGS. 1 through 6.

DETAILED DESCRIPTION OF THE INVENTION

A description will now be given with reference to the accompanying drawings as to how the present invention is embodied in practice.

Figure 1:
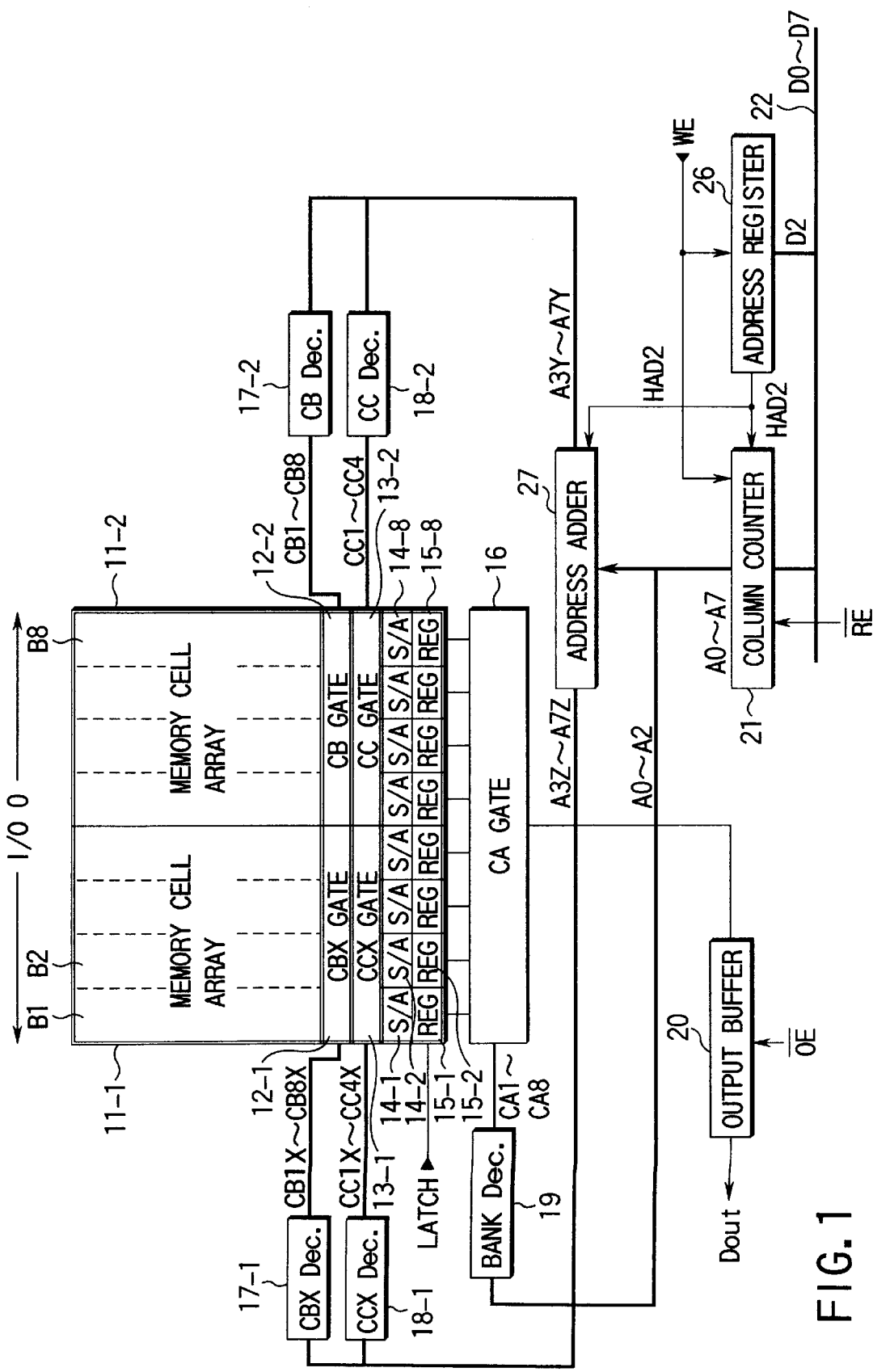
FIG. 1 illustrates a semiconductor memory device according to the first embodiment of the present invention; it is a block circuit diagram showing the circuit portion which is related to the selection of a column address of a serial-access ROM.

FIG. 1 is a block circuit diagram schematically showing a semiconductor memory device according to the first embodiment of the present invention. The Figure shows the circuit portion which is related to the selection of a column address of a serial-access ROM.

Referring to FIG. 1, reference numerals 11-1 and 11-2 denotes two memory cell arrays. Memory cell array 11-1 is "divided" into four banks B1–B4, and memory cell array 11-1, into four banks B5–B8. Although the word "divided" is used herein, this does not necessarily mean that the pattern or circuit of each memory cell array is physically divided. The word "divided" circuit that logically independent addresses are used. Reference numeral 12-1 denotes a first column gate (CBX gate) provided for memory cell array 11-1; likewise, reference numeral 13-1 denotes a second column gate (CCX gate). Reference numeral 12-2 denotes a third column gate (CB gate) provided for memory cell array 11-2; likewise, reference numeral 13-2 denotes a fourth column gate (CC gate). Reference numerals 14-1 to 14-8 denote sense amplifiers (S/A) corresponding to the banks B1 to B8, respectively, and reference numerals 15-1 to 15-8 denote registers (REG) corresponding to the banks B1 to B8, respectively. Reference numeral 16 denotes fifth column gates (CA gate) for selecting the banks B1 to B8. Reference numeral 17-1 denotes a first column decoder (CBX DEC.) for selectively driving the first column gate 12-1. Reference numeral 18-1 denotes a second column decoder (CCX DEC.) for selectively driving the second column gate 13-1. Reference numeral 17-2 denotes a third column decoder (CB DEC.) for selectively driving the third column gate 12-2. Reference numeral 18-2 denotes a fourth column decoder (CC DEC.) for selectively driving the fourth column gate 13-2. Reference numeral 19 denotes a bank decoder for selectively driving the MOS transistors incorporated in the fifth column gates 16. Reference numeral 20 denotes an output buffer for sequentially outputting the data latched in the registers 15-1 to 15-8. Reference numeral 21 denotes a column counter for generating column addresses. Reference numeral 22 denotes a column address signal line through which a read start address D0–D7 are supplied to the column counter 21. Reference numeral 26 denotes an address register for latching part D2 of the read start address supplied through the column address signal line 22. The latched address part D2 is used for determining whether the selected bank is one of the banks B1–B4 of memory cell array 11-1 or one of the banks B5–B8 of memory cell array 11-2. Reference numeral 27 is an address adder for incrementing the address generated by the column counter 21 by 1 and outputting the 1-incremented column address.

The read start address D0–D7 supplied to the column address signal line 22 is input to the column counter 21 and is latched thereby in synchronism with signal WE (Write Enable signal). The latched read start address is sequentially counted up, thereby generating a column address A0–A7. Of the 8-bit count (column address) output from the column counter 21, the upper three bits A0–A2 are supplied to the bank decoder 19, while the lower five bits A3–A7 are supplied to the address adder 27. One bit D2 of the read start address supplied to the column address signal line 22 is input to the address register 26 and is latched thereby in response to signal WE. The address register 26 determines whether the lower banks B1–B4 or the upper banks B5–B8 are designated on the basis of the read start address D0–D7. In other words, the address register 26 determines whether the cell transistor selected on the basis of the read start address D0–D7 is included in memory cell array 11-1 or memory cell array 11-2. Output signal HAD2 from the address register 26 is supplied to both the column counter 21 and the address adder 27. Output signals A3Z–A7Z from the address adder 27 are supplied to both the first and second decoders 17-1 and 18-1, while output signals A3Y–A7Y therefrom are supplied to both the third and fourth decoders 17-2 and 18-2. When the address register 26 senses that the cell transistor designated by the read start address D0–D7 is included in the lower banks B1–B4, the address adder 27 does not add any number to the address sent from the column counter 21 and outputs that address as it is. On the other hand, when the address register 26 senses that the designated cell transistor is included in the upper banks B5–B8, the address adder 27 increments the column address of the lower banks B1–B4 by 1, without adding any number to the column address of the upper banks B5–B8. Accordingly, when a cell transistor included in the upper banks B5–B8 is designated on the basis of the read start address, the column corresponding to the read start address is selected in the upper banks B5–B8, and the column corresponding to the 1-incremented column address is selected in the lower banks B1–B4.

The count signals A3Z–A7Z supplied to each of the first and second decoders 17-1 and 18-1 are decoded, and the cell transistors of one column of each of the banks B1–B4 are selected. The count signals A3Y–A7Y supplied to each of the third and fourth decoders 17-2 and 18-2 are decoded, and the cell transistors of one column of each of the banks B5–B8 are selected. In addition, a word line is selected by a row decoder (not shown), with the result that one cell transistor is selected in each of the banks B1–B8. The data stored in the selected cell transistors are supplied to the sense amplifiers 14-1 to 14-8, by which they are sensed and amplified. Thereafter, the data are supplied to the registers 15-1 to 15-8 and are latched thereby in response to a latch signal LATCH. The count signals A0–A2 supplied to the bank decoder 19 are decoded to control the selection of the eight banks B1–B8. Hence, the data read out from the cell transistors of the banks B1–B8 and latched in the registers 15-1 to 15-8 are sequentially output such that the fifth column gate 16–x(x=1 to 8) corresponding to the address designated by the read start address D0–D7 is turned on first of all. When, at the time, a cell transistor within memory cell 11-1 is designated on the basis of the read start address D0–D7, data are sequentially read out from the designated bank to an upper-address bank. On the other hand, when a cell transistor within memory cell 11-2 is designated, data are sequentially read out from the designated bank to an upper-address bank, and data corresponding to a 1-incremented column address are read out from the lower banks B1–B4.

Figure 2:
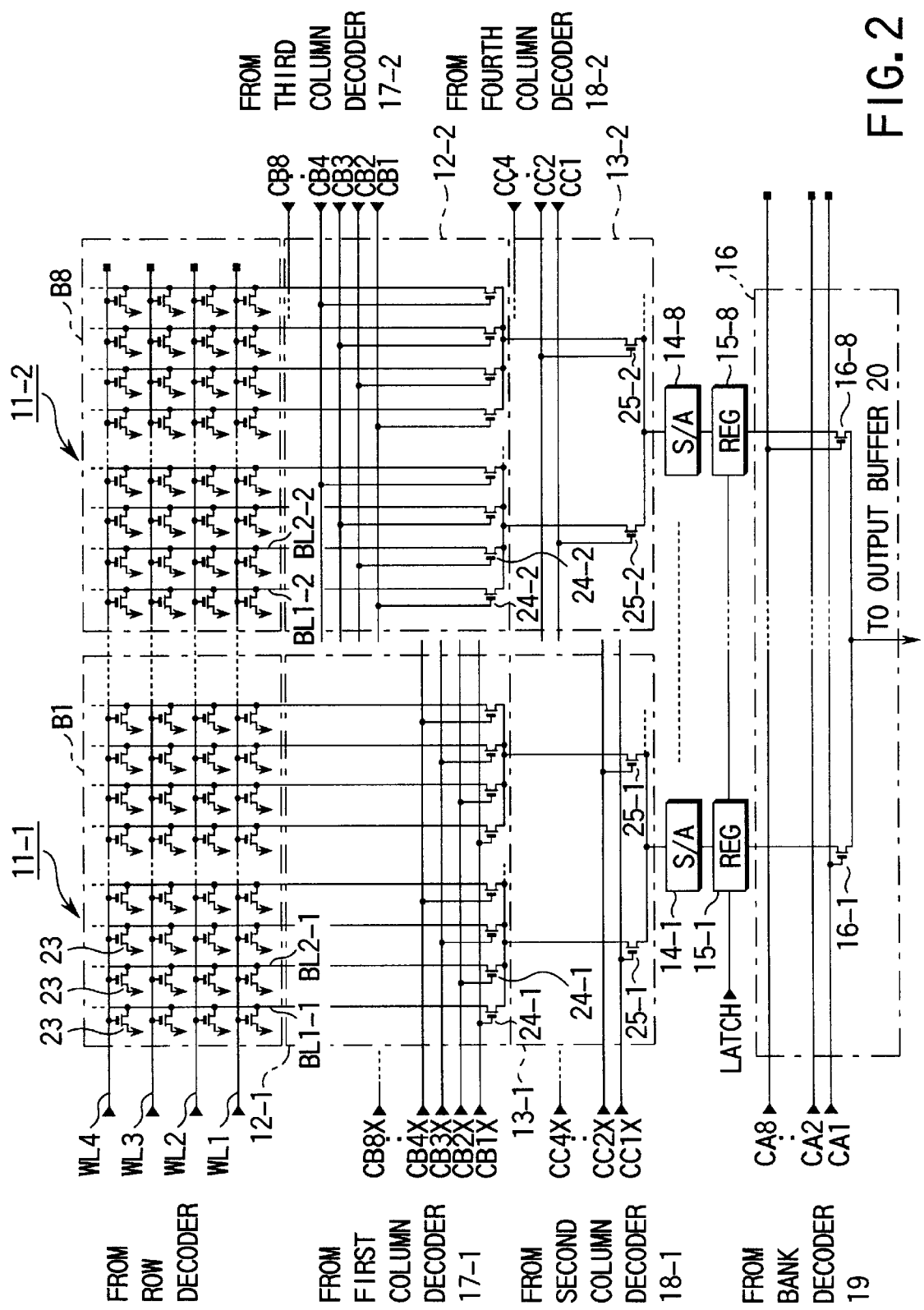
FIG. 2 is a detailed circuit diagram showing the memory cell array, first and second column gates and third and fourth column gates of FIG. 1, along with the related peripheral circuits.

FIG. 2 is a detailed circuit diagram showing the memory cell array 11-1 and 11-2, first and second column gates 12-1 and 13-1, and third and fourth column gates 12-2 and 13-2 shown in FIG. 1, along with the related peripheral circuits (namely, the sense amplifiers 14-1 to 14-8, registers 15-1 to 15-8 and fifth column gates 16-1 to 16-8). In each of the banks B1 to B8 of the memory cell arrays 11-1 and 11-2, cell transistors 23 are arranged in a matrix pattern. Each of the cell transistors 23 stores data of either "0" or "1", depending upon whether or not ions are injected in the channel region, whether or not a gate electrode is present or absent, and whether or not a source/drain region is present or absent. The gate electrodes of the cell transistors 23 of each row is connected to one of word lines WL1, WL2, . . . . The drains of the cell transistors 23 of each column are connected to one of bit lines BL1-1, BL2-1, . . . . The sources of the cell transistors 23 are connected (grounded) to a common source line. The first ends of the current paths of MOS transistors 24-1 serving as the first column gate 12-1 are connected to the respective bit lines BL1-1, BL2-1, . . . . The second ends of the current paths of the MOS transistors 24-1 are connected to common connection points such that a predetermined number of them are connected to one common connection point. The gate electrodes of the MOS transistors 24-1 are supplied with output signals CB1X–CB8X from the first column decoder 17-1, and are therefore selectively turned on or off. The first ends of the current paths of MOS transistors 25-1 serving as the second column gate 13-1 are connected to the common connection points to which the second ends of the current paths of MOS transistors 24-1 are connected. The second ends of the current paths of MOS transistors 25-1 are connected to the sense amplifiers 14-1, etc. such that a predetermined number of the second ends are connected to the same sense amplifier. The gate electrodes of MOS transistors 25-1 are supplied with output signals CC1X–CC4X from the second column decoder 18-1, and are therefore selectively turned on or off. Similarly, in memory cell array 11-2, the first ends of the current paths of MOS transistors 24-2 serving as the third column gate 12-2 are connected to the respective bit lines BL1-2, BL2-2, . . . . The second ends of the current paths of the MOS transistors 24-2 are connected to common connection points such that a predetermined number of them are connected to one common connection point. The gate electrodes of the MOS transistors 24-2 are supplied with output signals CB1–CB8 from the third column decoder 17-2, and are therefore selectively turned on or off. The first ends of the current paths of MOS transistors 25-2 serving as the fourth column gate 13-2 are connected to the common connection points to which the second ends of the current paths of MOS transistors 24-2 are connected. The second ends of the current paths of MOS transistors 25-2 are connected to the sense amplifiers 14-8, etc. such that a predetermined number of the second ends are connected to the same sense amplifier. The gate electrodes of MOS transistors 25-2 are supplied with output signals CC1–CC4 from the fourth column decoder 18-2, and are therefore selectively turned on or off.

The output signals from the sense amplifiers 14-1 to 14-8 are supplied to the registers 15-1 to 15-8, respectively. The registers 15-1 to 15-8 latch the output signals from the sense amplifiers 14-1 to 14-8, in response to latch signal LATCH. The first ends of the current paths of the fifth column gates (MOS transistors) 16-1 to 16-8 are connected to the output terminals of the registers 15-1 to 15-8, respectively. The second end of the current paths of the MOS transistors 16-1 to 16-8 are connected together and led to the input terminal of the same output buffer 20. The gate electrodes of the MOS transistors 16-1 to 16-8 are supplied with the output signals CA1 to CA8 from the bank decoder 19 and are therefore selectively turned on or off.

Figure 3:
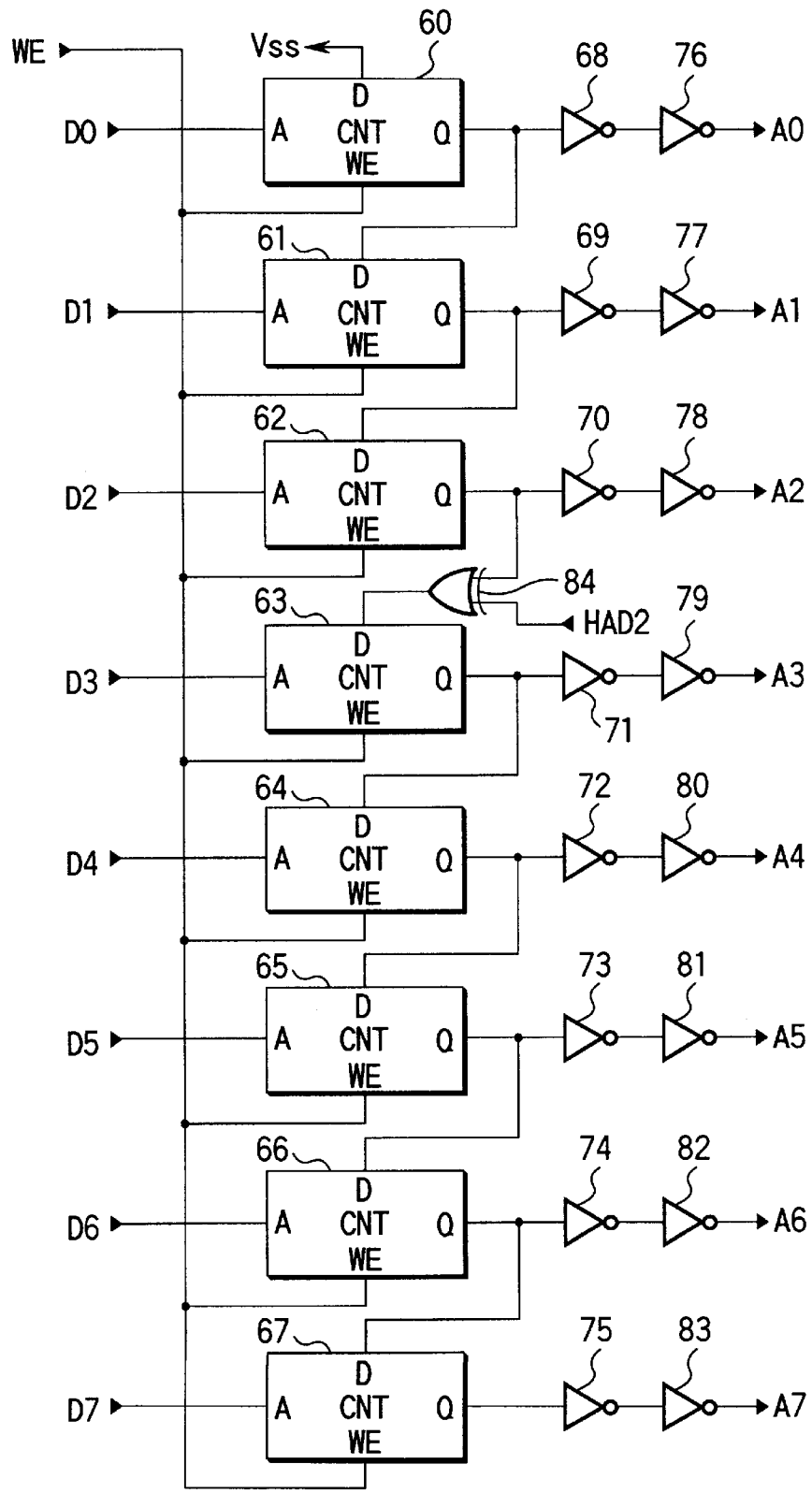
FIG. 3 is a circuit diagram showing an example of a column counter applicable to the circuit shown in FIG. 1.

FIG. 3 shows an example of a circuit configuration of the column counter 21 employed in the circuit depicted in FIG. 1. The column counter 21 shown in FIG. 3 is made up of eight binary counters (CNT) 60–67, sixteen inverters 68–83 and an exclusive-OR gate 84. The bits of the 8-bit read start address D0–D7 are input to the input terminals A of the binary counters 60–67, respectively. Signal WE, in response to which the input bits of the read start address D0–D7 are latched. is supplied to the input terminals WE of the binary counters 60–67. The data input terminal D of the first-stage binary counter 60 is connected to a ground point Vss, and the output terminal Q of that binary counter 60 is connected to the data input terminal D of binary counter 61. Likewise, the output terminal Q of binary counter 61 is connected to the data input terminal D of binary counter 62. One of the two input terminals of the exclusive-OR gate 84 is connected to the output terminal Q of binary counter 62, the other input terminal thereof is supplied with signal HAD2, and the output terminal thereof is connected to the data input terminal D of binary counter 63. When signal HAD2 is at the "H" level, column address signals A3–A7 are incremented after data is output from bank B4. On the other hand, when signal HAD2 is at the "L" level, column address signals A0-A7 are incremented after data is output from bank B8. The output terminals of binary counters 63–66 are connected to the data input terminals D of binary counters 64–67, respectively. The input terminals of inverters 68–75 are connected to the output terminals Q of the binary counters 60–67, respectively, and the output terminals of these inverters 68–75 are connected to the input terminals of inverters 76–83, respectively. Column address signals A0–A7 are output from the output terminals of inverters 76–83, respectively.

Figure 4:
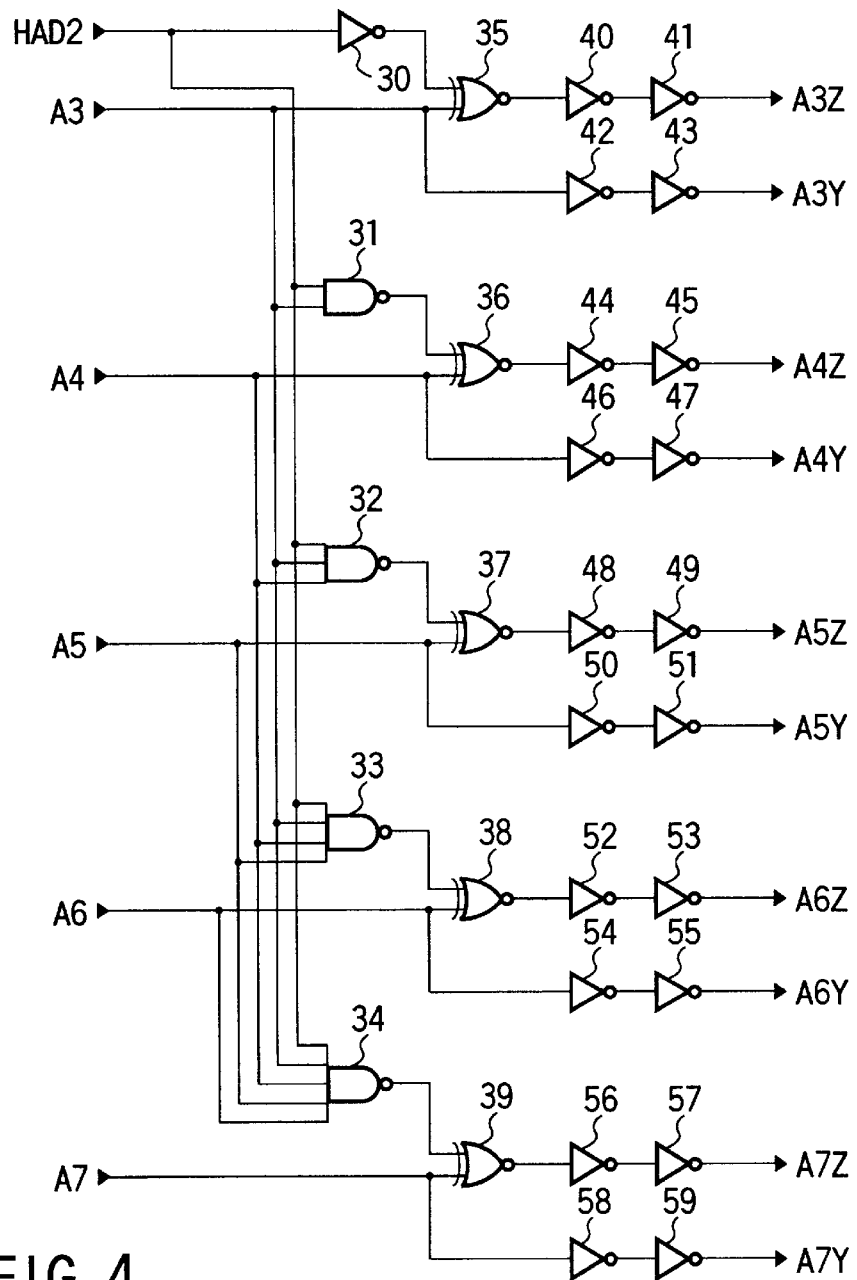
FIG. 4 is a circuit diagram showing an example of an address counter applicable to the circuit shown in FIG. 1.

FIG. 4 shows an example of a circuit configuration of the address adder 27 employed in the circuit depicted in FIG. 1. The address adder 27 shown in FIG. 4 is made up of inverter 30, NAND gates 31–34, exclusive-OR gates 35–39 and inverters 40–59. Output signal HAD2 from the address register 26 is supplied to the input terminal of inverter 30, one of the two input terminals of NAND gate 31, and the first input terminals of NAND gates 32–34. Column address bit A3 output from the column counter 21 is supplied to one of the two input terminals of exclusive-OR gate 35, the input terminal of inverter 42, the other input terminal of NAND gate 31, and the second input terminals of NAND gates 32–34. Column address bit A4 output from the column counter 21 is supplied to one of the two input terminals of exclusive-OR gate 36, the input terminal of inverter 46, and the third input terminals of NAND gates 32–34. Column address bit A5 is supplied to one of the two input terminals of exclusive-OR gate 37, the input terminal of inverter 50, and the fourth input terminals of NAND gates 33–34. Column address bit A6 is supplied to one of the two input terminals of exclusive-OR gate 38, the input terminal of inverter 54, and the fifth input terminal of NAND gate 34. Column address bit A7 is supplied to one of the two input terminals of exclusive-OR gate 39, and to the input terminal of inverter 58.

An output from inverter 30 is supplied to the other input terminal of exclusive-OR gate 35, and an output from this exclusive-OR gate 35 is supplied to the input terminal of inverter 40. An output from NAND gate 31 is supplied to the other input terminal of exclusive-OR gate 36, and an output from this exclusive-OR gate 36 is supplied to the input terminal of inverter 44. An output from NAND gate 32 is supplied to the other input terminal of exclusive-OR gate 37, and an output from this exclusive-OR gate 37 is supplied to the input terminal of inverter 48. An output from NAND gate 33 is supplied to the other input terminal of exclusive-OR gate 38, and an output from this exclusive-OR gate 38 is supplied to the input terminal of inverter 52. Further, an output from NAND gate 34 is supplied to the other input terminal of exclusive-OR gate 39, and an output from this exclusive-OR gate 39 is supplied to the input terminal of inverter 56. Outputs from inverters 40, 44, 48, 52 and 56 are supplied to inverters 41, 45, 49, 53 and 57, respectively, and output signals A3Z to A7Z from these inverters 41, 45, 49, 53 and 57 are supplied to each of the first and second column decoders 17-1 and 18-1. Outputs from inverters 42, 46, 50, 54 and 58 are supplied to inverters 42, 47, 51, 55 and 59, respectively, and output signals A3Y to A7Y from these inverters 42, 47, 51, 55 and 59 are supplied to each of the third and fourth column decoders 17-2 and 18-2.

When the output signal HAD2 from the address register 26 is at the "H" level, the address adder 27 shown in FIG. 4 increments column address bits A3–A7 by 1 and supplies the 1-incremented signals A3Z to A7Z to each of the first and second column decoders 17-1 and 18-1. When output signal HAD2 is at the "L" level, the address adder 27 supplies signals A3Z to A7Z, which are obtained by buffering the column address bits A3–A7, to each of the first and second column decoders 17-1 and 18-1. Irrespective of the level of the output signal HAD2 from the address register 26, the address adder 27 supplies signals A3Y to A7Y, which are obtained by buffering the column address bits A3–A7, to each of the third and fourth column decoders 17-2 and 18-2.

An example of an operation performed by the address adder shown in FIG. 4 will be described. In the descriptions below, it is assumed that the "H" level signal is "1" and the "L" level signal is "0". The operation will be referred to is the case where the column address is "01111" (that is, signals A3–A7 are "1", "1", "1", "1" and "0", respectively) and signal HAD2 is "0".

Upon receipt of HAD2 signal "0", inverter 30 outputs "1". The exclusive-OR gate (hereinafter referred to as a coincidence circuit) 35, the output terminal of which is connected to inverters, receives output signal "1" of inverter 30 and A3 signal "1", and outputs signal "1". This output "1" from the gate 35 is supplied through inverters 40 and 41 and used as signal A3Z. A3 signal "1" supplied through inverters 42 and 43 is used as signal A3Y.

NAND gate 31 receives HAD2 signal "0" and A3 signal "1", and outputs signal "1". Coincidence circuit 36 receives output signal "1" of gate 31 and A4 signal "1", and outputs signal "1". This output "1" from the gate 36 is supplied through inverters 44 and 45 and used as signal A4Z. A4 signal "1" supplied through inverters 46 and 47 is used as signal A4Y.

NAND gate 32 receives HAD2 signal "0", A3 signal "1" and A4 signal "1", and outputs signal "1". Coincidence circuit 37 receives output signal "1" of gate 32 and A5 signal "1", and outputs signal "1". This output "1" from the gate 37 is supplied through inverters 48 and 49 and used as signal A5Z. A5 signal "1" supplied through inverters 50 and 51 is used as signal A5Y.

NAND gate 33 receives HAD2 signal "0", A3 signal "1", A4 signal "1" and A5 signal "1", and outputs signal "1". Coincidence circuit 38 receives output signal "1" of gate 33 and A6 signal "1", and outputs signal "1". This output "1" from the gate 38 is supplied through inverters 52 and 53 and used as signal A6Z. A6 signal "1" supplied through inverters 54 and 55 is used as signal A6Y.

NAND gate 34 receives HAD2 signal "0", A3 signal "1", A4 signal "1", A5 signal "1" and A6 signal "1", and outputs signal "1". Coincidence circuit 39 receives output signal "1" of gate 34 and A7 signal "0", and outputs signal "0". This output "0" from the gate 39 is supplied through inverters 56 and 57 and used as signal A7Z. A7 signal "0" supplied through inverters 58 and 59 is used as signal A7Y.

As explained above, when the address adder receives column address signal "01111" in the case where HAD2 signal is "0", the column address signal A3Z–A7Z that is supplied to memory cell array 11-1 is "01111", and the column address signal A3Y–A7Y that is supplied to memory cell array 11-2 is likewise "01111".

Next, a description will be given as to how the address adder operates when it receives column address signal "01111" in the case where output signal HAD2 is "1".

Upon receipt of HAD2 signal "1", inverter 30 outputs "0". Coincidence circuit 35 receives output signal "0" of inverter 30 and A3 signal "1", and outputs signal "0". This output "0" from the gate 35 is supplied through inverters 40 and 41 and used as signal A3Z. A3 signal "1" supplied through inverters 42 and 43 is used as signal A3Y.

NAND gate 31 receives HAD2 signal "1" and A3 signal "1", and outputs signal "0". Coincidence circuit 36 receives output signal "0" of gate 31 and A4 signal "1", and outputs signal "0". This output "0" from the gate 36 is supplied through inverters 44 and 45 and used as signal A4Z. A4 signal "1" supplied through inverters 46 and 47 is used as signal A4Y.

NAND gate 32 receives HAD2 signal "1", A3 signal "1" and A4 signal "1", and outputs signal "0". Coincidence circuit 37 receives output signal "1" of gate 32 and A5 signal "1", and outputs signal "0". This output "0" from the gate 37 is supplied through inverters 48 and 49 and used as signal A5Z. A5 signal "1" supplied through inverters 50 and 51 is used as signal A5Y.

NAND gate 33 receives HAD2 signal "1", A3 signal "1", A4 signal "1" and A5 signal "1", and outputs signal "0". Coincidence circuit 38 receives output signal "0" of gate 33 and A6 signal "1", and outputs signal "0". This output "0" from the gate 38 is supplied through inverters 52 and 53 and used as signal A6Z. A6 signal "1" supplied through inverters 54 and 55 is used as signal A6Y.

NAND gate 34 receives HAD2 signal "1", A3 signal "1", A4 signal "1", A5 signal "1" and A6 signal "1", and outputs signal "0". Coincidence circuit 39 receives output signal "1" of gate 34 and A7 signal "0", and outputs signal "1". This output "1" from the gate 39 is supplied through inverters 56 and 57 and used as signal A7Z. A7 signal "0" supplied through inverters 58 and 59 is used as signal A7Y.

As explained above, when the address adder receives column address signal "01111" in the case where HAD2 signal is "1", the column address signal A3Z–A7Z that is supplied to memory cell array 11-1 is "10000", while the column address signal A3Y–A7Y that is supplied to memory cell array 11-2 is "01111".

Figure 5:
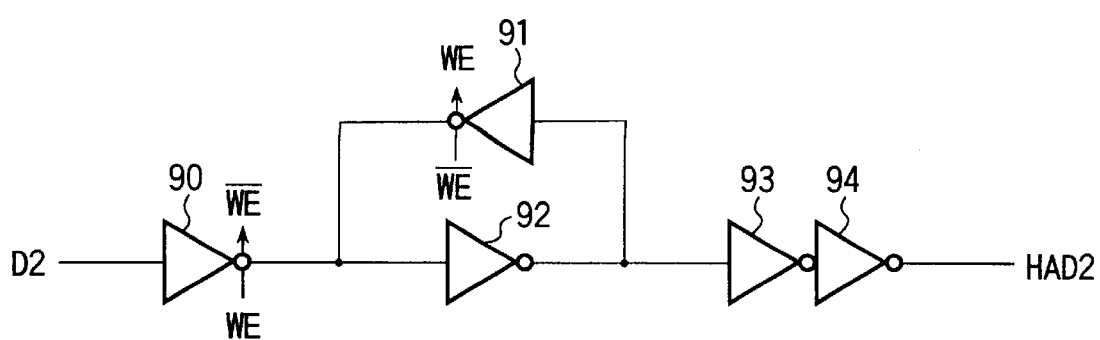
FIG. 5 is a circuit diagram showing an example of an address register applicable to the circuit shown in FIG. 1.

FIG. 5 shows an example of the address register 26 applicable to the circuit shown in FIG. 1. The address register 26 includes closed inverters 90 and 91 which are controlled signals WE and /WE (the virgule "/" inserted before a reference symbol is intended to indicate an inverted signal, which is sometimes represented by placing an upper bar to a reference symbol), and further includes inverters 92, 93 and 94. One bit D2 of the column address D0–D7 supplied to the column address signal line 22 is supplied to the input terminal of clocked inverter 90. In synchronism with signals WE and /WE, the inverted signal of D2 is supplied to the input terminal of inverter 92. The output terminal of clocked inverter 91 is connected to the input terminal of inverter 92, and the input terminal of clocked inverter 91 is connected to the output terminal of inverter 92, thus forming a latch circuit. By this latch circuit, the output signal of clocked inverter 90 is latched. An output from this latch circuit is buffered by inverters 93 and 94, thereby producing signal HAD2. Signal HAD2, thus produced, is supplied to the column counter 21 and the address adder 27.

The address register 26 described above is used for determining whether the read start address D0–D7 designates a cell transistor in memory cell array 11-1 or a cell transistor in memory cell array 11-2. In other words, the address register 26 determines which one of the eight banks B1–B8 includes the cell transistor 23 designated by the read start address D0–D7. When bit D2 of the column address is at the "H" level, it is determined that memory cell array 11-2 (one of banks B5–B8) is designated. In this case, the output signal HAD2 of the address register 26 is set at the "H" level, and signals A3Z–A7Z output from the address adder 27 are 1-incremented address signals. On the other hand, when bit D2 of the column address is at the "L" level, signal HAD2 is set at the "L" level, and it is determined that memory cell array 11-1 (one of banks B1–B4) is designated. In this case, signals A3Z–A7Z output from the address adder 27 are signals obtained by buffering column address signals A3–A7.

When signal HAD2 supplied to the column counter 21 is at the "H" level, a signal obtained by inverting an output signal of binary counter 62 is supplied from exclusive-OR gate 84 to the data input terminal D of binary counter 63. Accordingly, the lower bits A3–A7 of the column address are incremented at delayed timings. On the other hands, when signal HAD2 is at the "L" level, the output signal of exclusive-OR gate 84 is the same as that of binary counter 62, and that output signal is supplied to the data input terminal D of binary counter 63. Accordingly, the column counters sequentially count up.

Figures 6A, 6B:
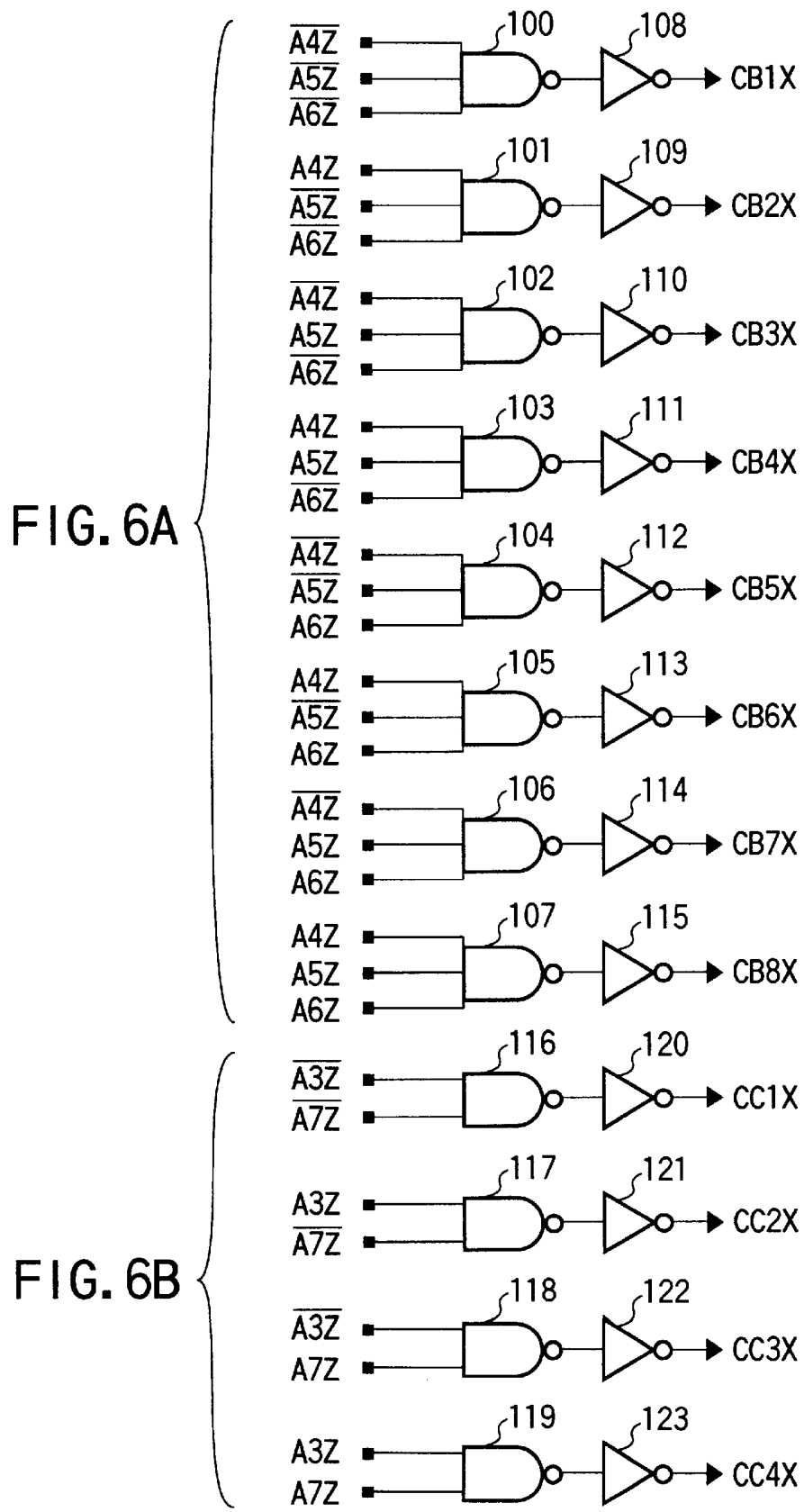
FIGS. 6A to 6E show examples of decoders applicable to the circuit shown in FIG. 1, FIG. 6A being a circuit diagram of a first decoder, FIG. 6B, that of a second decoder, FIG. 6C, that of a third decoder, FIG. 6D, that of a fourth decoder, and FIG. 6E, that of a bank decoder.
Figure 6C:
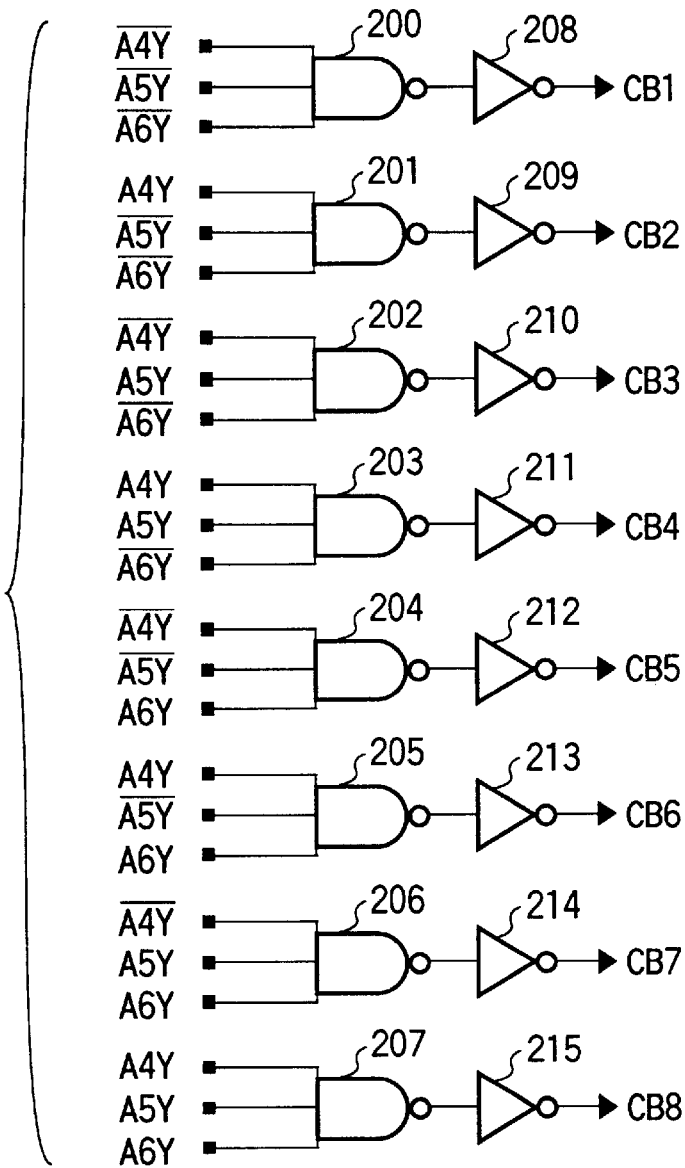
Figure 6D:
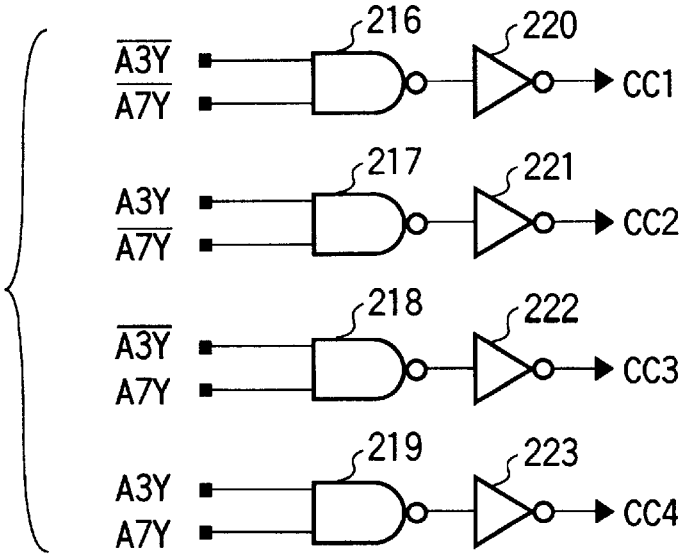
Figure 6E:
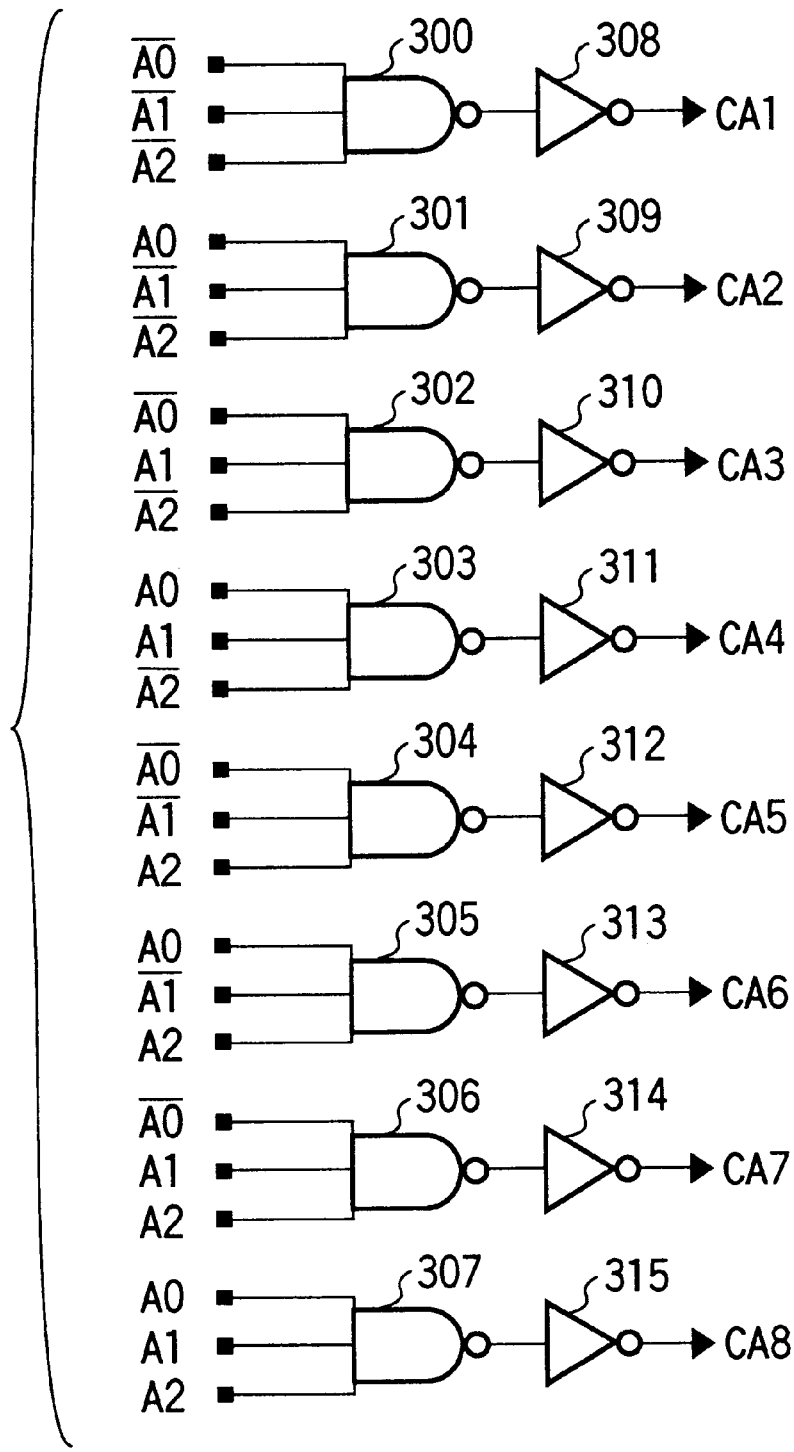

FIGS. 6A–6E show examples of the decoders employed in the circuit shown in FIG. 1. FIG. 6A shows the first decoder 17-1, FIG. 6B shows the second decoder 18-1, FIG. 6C shows the third decoder 17-2, FIG. 6D shows the fourth decoder 18-2, and FIG. 6E shows the bank decoder 19.

As shown in FIG. 6A, the first decoder 17-1 is made up of NAND gates 100–107 and inverters 108–115. NAND gate 100 is supplied with signals /A4Z, /A5Z and /A6Z output from the address adder 27, and an output from that NAND gate 100 is supplied through inverter 108 and output as decode signal CB1X. NAND gate 101 is supplied with signals A4Z, /A5Z and /A6Z, and an output from that NAND gate 101 is supplied through inverter 109 and output as decode signal CB2X. NAND gate 102 is supplied with signals /A4Z, A5Z and /A6Z, and an output from that NAND gate 102 is supplied through inverter 110 and output as decode signal CB3X. NAND gate 103 is supplied with signals A4Z, A5Z and /A6Z, and an output from that NAND gate 103 is supplied through inverter 111 and output as decode signal CB4X. NAND gate 104 is supplied with signals /A4Z, /A5Z and A6Z, and an output from that NAND gate 104 is supplied through inverter 112 and output as decode signal CB5X. NAND gate 105 is supplied with signals A4Z, /A5Z and A6Z, and an output from that NAND gate 105 is supplied through inverter 113 and output as decode signal CB5X. NAND gate 106 is supplied with signals /A4Z, A5Z and A6Z, and an output from that NAND gate 106 is supplied through inverter 114 and output as decode signal CB7X. NAND gate 107 is supplied with signals A4Z, A5Z and A6Z, and an output from that NAND gate 107 is supplied through inverter 115 and output as decode signal CB8X.

As shown in FIG. 6B, the second decoder 18-1 is made up of NAND gates 116–119 and inverters 120–123. NAND gate 116 is supplied with signals /A3Z and /A7Z, and an output from that NAND gate 116 is supplied through inverter 120 and output as decode signal CC1X. NAND gate 117 is supplied with signals A3Z and /A7Z, and an output from that NAND gate 117 is supplied through inverter 121 and output as decode signal CC2X. NAND gate 118 is supplied with signals /A3Z and A7Z, and an output from that NAND gate 118 is supplied through inverter 122 and output as decode signal CC3X. NAND gate 119 is supplied with signals A3Z and A7Z, and an output from that NAND gate 119 is supplied through inverter 123 and output as decode signal CC4X.

As shown in FIG. 6C, the third decoder 17-2 is made up of NAND gates 200–207 and inverters 208–215. NAND gate 200 is supplied with signals /A4Y, /A5Y and /A6Y, and an output from that NAND gate 200 is supplied through inverter 208 and output as decode signal CB1. NAND gate 201 is supplied with signals A4Y, /A5Y and /A6Y, and an output from that NAND gate 201 is supplied through inverter 209 and output as decode signal CB2. NAND gate 202 is supplied with signals /A4Y, A5Y and /A6Y, and an output from that NAND gate 202 is supplied through inverter 210 and output as decode signal CB3. NAND gate 203 is supplied with signals A4Y, A5Y and /A6Y, and an output from that NAND gate 203 is supplied through inverter 211 and output as decode signal CB4. NAND gate 204 is supplied with signals /A4Y, /A5Y and A6Y, and an output from that NAND gate 204 is supplied through inverter 212 and output as decode signal CB5. NAND gate 205 is supplied with signals A4Y, /A5Y and A6Y, and an output from that NAND gate 205 is supplied through inverter 213 and output as decode signal CB6. NAND gate 206 is supplied with signals /A4Y, A5Y and A6Y, and an output from that NAND gate 206 is supplied through inverter 214 and output as decode signal CB7. NAND gate 207 is supplied with signals A4Y, A5Y and A6Y, and an output from that NAND gate 207 is supplied through inverter 215 and output as decode signal CB8.

As shown in FIG. 6D, the fourth decoder 18-2 is made up of NAND gates 216–219 and inverters 220–223. NAND gate 216 is supplied with signals /A3Y and /A7Y, and an output from that NAND gate 216 is supplied through inverter 220 and output as decode signal CC1. NAND gate 217 is supplied with signals A3Y and /A7Y, and an output from that NAND gate 217 is supplied through inverter 221 and output as decode signal CC2. NAND gate 218 is supplied with signals /A3Y and A7Y, and an output from that NAND gate 218 is supplied through inverter 222 and output as decode signal CC3. NAND gate 219 is supplied with signals A3Y and A7Y, and an output from that NAND gate 219 is supplied through inverter 223 and output as decode signal CC4.

As shown in FIG. 6E, the bank decoder 19 is made up of NAND gates 300–307 and inverters 308–315. NAND gate 300 is supplied with signals /A0, /A1 and /A2, and an output from that NAND gate 300 is supplied through inverter 308 and output as decode signal CA1. NAND gate 301 is supplied with signals A0, /A1 and /A2, and an output from that NAND gate 301 is supplied through inverter 309 and output as decode signal CA2. NAND gate 302 is supplied with signals /A0, A1 and /A2, and an output from that NAND gate 302 is supplied through inverter 310 and output as decode signal CA3. NAND gate 303 is supplied with signals A0, A1 and /A2, and an output from that NAND gate 303 is supplied through inverter 311 and output as decode signal CA4. NAND gate 304 is supplied with signals /A0, /A1 and A2, and an output from that NAND gate 304 is supplied through inverter 312 and output as decode signal CA5. NAND gate 305 is supplied with signals A0, /A1 and A2, and an output from that NAND gate 305 is supplied through inverter 313 and output as decode signal CA6. NAND gate 306 is supplied with signals /A0, A1 and A2, and an output from that NAND gate 306 is supplied through inverter 314 and output as decode signal CA7. NAND gate 307 is supplied with signals A0, A1 and A2, and an output from that NAND gate 307 is supplied through inverter 315 and output as decode signal CA8.

A data read operation for the serial-access ROM shown in FIGS. 1 to 6 will be described with reference to the timing charts in FIGS. 7A to 7G and 8A to 8G. FIGS. 7A to 7G illustrate signals and an operation condition when a cell transistor 23 of bank B1 is designated by the read start address, and FIGS. 8A to 8G illustrate signals and operating condition when a cell transistor 23 of bank B7 is designated.

Figure 9A:
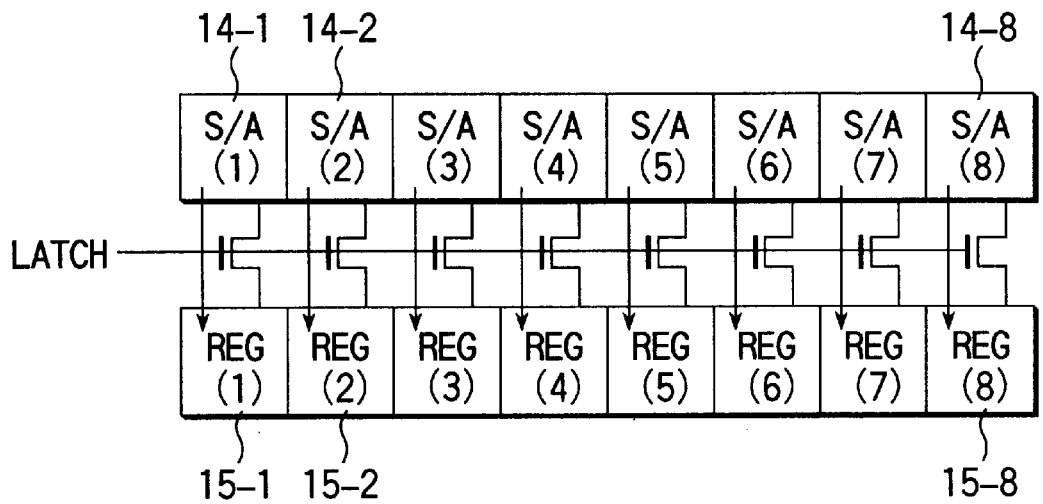
FIGS. 9A and 9B illustrate data which are transferred from sense amplifiers to registers in the circuits shown in FIGS. 1 through 6, FIG. 9A being a schematic illustration corresponding to the operation illustrated in the timing charts shown in FIGS. 7A to 7G, and FIG. 9B being a schematic illustration corresponding to the operation illustrated in the timing charts shown in FIGS. 8A to 8G.

First, an operation (FIGS. 7A to 7G) for reading out data from bank B1 will be described. When the read start address D0–D7 is supplied to the column address signal line 22, it is set in the column counter 21 as an initial value in response to signal WE shown in FIG. 7A. In addition, bit D2 of the read start address is latched in the address register 26. The address register 26 determines whether a cell transistor 23 of memory cell array 11-2 or a cell transistor of memory cell array 11-2 is selected by the read start address. In other words, the address register 26 determines which of the banks B1–B8 includes the cell transistor 23 for which the data read operation is executed first of all. In the case illustrated in FIGS. 7A to 7G, it is assumed that bank B1 is selected by the read start address and bit D2 of the read start address is at the "L" level. The read start address set in the column counter 21 is supplied to the address adder 27. Output signals A3Z–A7Z of this address adder 27 are supplied to decoders 17-1 and 18-1, while output signals A3Y–A7Y thereof are supplied to decoders 17-2 and 18-2. Since the output signal HAD2 of the address register 26 is at the "L" level then, address increment is not performed. Column gate 12-1 is controlled by output signals CB1X–CB8X of decoder 17-1, and column gate 13-1 is controlled by output signals CC1X–CC4X of decoder 18-1. Data read out from banks B1–B4 are supplied to sense amplifiers 14-1 to 14-4, by which the data are sensed and amplified. Likewise, column gate 12-2 is controlled by output signals CB1–CB8 of decoder 17-2, and column gate 13-2 is controlled by output signals CC1–CC4 of decoder 18-2. Data read out from banks B5–B8 are supplied to sense amplifiers 14-5 to 14-8, by which the data are sensed and amplified. Output signals of the sense amplifiers 14-1 to 14-8 are supplied to the registers 15-1 to 15-8, respectively, and are latched thereby in response to the latch signal LATCH rising to the "H" level. This state is schematically shown in FIG. 9A. Subsequently, the column counter 21 counts up, and the resultant signals are supplied to the address adder 27. As a result, countup address signals are supplied to the decoders 17-1, 18-1, 17-2 and 18-2, by which they are decoded. Thus, data stored in the cell transistors of the next columns of the respective banks B1–B8 are supplied to the sense amplifiers 14-1 to 14-8, by which the data are sensed and amplified. Next, a ready/busy signal is set at the "H" level, and an output enable signal /OE supplied to the output buffer 20 is set at the "L" level. The column gates 16-1 to 16-8 are sequentially turned on by the bank decoder 19, and the data stored in the cell transistors 23 of the selected columns of the banks B1–B8 are sequentially output as output data Dout in response to read enable signal /RE. When output of the data from the banks B1 to B8 comes to an end, and the latch signal LATCH becomes "H" in level, the data corresponding to the 1-incremented column address signals (i.e., the data stored in the cell transistors of the next columns of the banks B1–B9) are sequentially output. By repeating this operation, the sensing of data and the output of data are performed in parallel, with the result that a successive data read operation is performed in synchronism with read enable signal /RE.

Figure 9B:
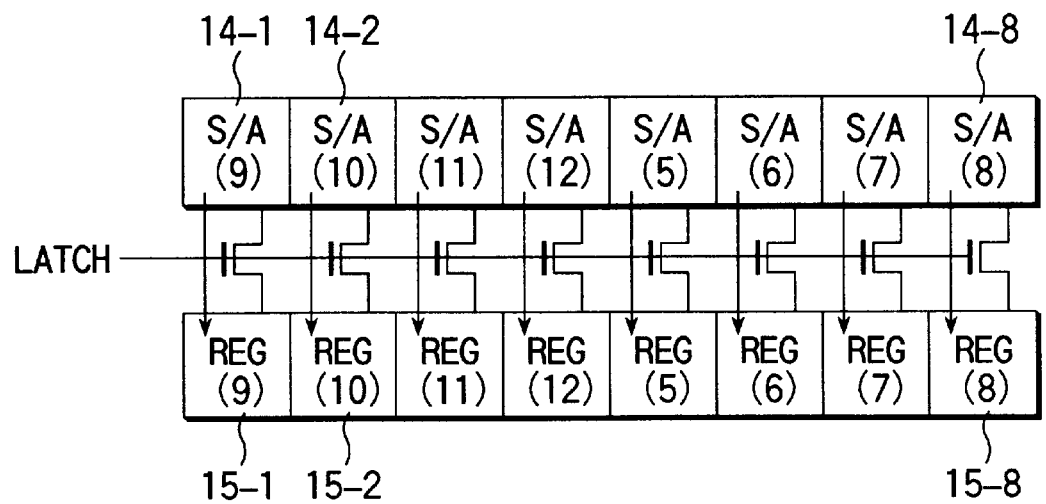

When a memory cell in bank B7 is designated by the read start address, the operation illustrated in the timing charts in FIGS. 8A to 8G is performed. This operation will be described next. When the read start address D0–D7 is supplied to the column address signal line 22, it is set in the column counter 21 in response to signal WE shown in FIG. 8A. In addition, bit D2 of the read start address is latched in the address register 26. Since the address register 26 selects bank B7 on the basis of the read address, bit D2 of the read address is at the "H" level. The read start address set in the column counter 21 is supplied to the address adder 27. Output signals A3Z–A7Z of the address adder 27 are supplied to decoders 17-1 and 18-1, while output signals A3Y–A7Y thereof are supplied to decoders 17-2 and 18-2. Since the output signal HAD2 of the address register 26 is at the "H" level then, signals A3Z–A7Z are incremented by 1. In addition, since signal HAD2 is at the "H" level, address signal A3 of the column counter 21 and the succeeding address signals are incremented at the timing when the processing advances from bank B4 to bank B5. Column gate 12-1 is controlled by output signals CB1X–CB8X of decoder 17-1, and column gate 13-1 is controlled by output signals CC1X–CC4X of decoder 18-1. Data read out from the cell transistors of the column address signals obtained by incrementing the bits of the read start address by 1 (i.e., the data read out from the cell transistors of the next columns of banks B1–B4) are supplied to sense amplifiers 14-1 to 14-4, by which the data are sensed and amplified. (The readout data are indicated by 9, 10, 11 and 12 in FIG. 8E). Likewise, column gate 12-2 is controlled by output signals CB1–CB8 of decoder 17-2, and column gate 13-2 is controlled by output signals CC1–CC4 of decoder 18-2. Data read out from banks B5–B8 (the readout data are indicated by 5, 6, 7 and 8 in FIG. BE) are supplied to sense amplifiers 14-5 to 14-8, by which the data are sensed and amplified. As can be seen from this, the data designated by the read start address from among the data in memory cell array 11-2 (i.e., the data indicated by 5, 6, 7 and 8 in FIG. 8E) and the data designated from among the data in the column next to that corresponding to the read start address (i.e., the data indicated by 9, 10, 11 and 12 in FIG. 8E) are sensed and amplified in parallel. Output signals of the sense amplifiers 14-1 to 14-8 are supplied to the registers 15-1 to 15-8, respectively, and are latched thereby in response to the latch signal LATCH rising to the "H" level. This state is schematically shown in FIG. 9B. Subsequently, the column counter 21 counts up, and the resultant signals are supplied to the address adder 27. As a result, count-up address signals are supplied to decoders 17-2 and 18-2, by which they are decoded. Address signals obtained by incrementing the count-up address signals by 1 are supplied to decoders 17-1 and 18-1, by which they are decoded. The column gates 12-1, 13-1, 12-2 and 13-2 are controlled by these decoders 17-1, 18-1, 17-2 and 18-2. Thus, data stored in the cell transistors of banks B17–B20 and B13–B16 are supplied to the sense amplifiers 14-1 to 14-8, by which the data are sensed and amplified. Next, a ready/busy signal shown in FIG. 8G is set at the "H" level, and an output enable signal /OE (FIG. 8B) supplied to the output buffer 20 is set at the "L" level. The column gates 16-7, 16-8, 16-1, . . . , 16-4 are sequentially turned on by the bank decoder 19, and the data stored in the cell transistors 23 of the selected columns of the banks B7, B8, B1, . . . , B4 designated by the start address and the data stored in the cell transistors 23 of the next columns are sequentially output in response to the read enable signal /RE shown in FIG. 8D. It should be noted that the data in banks B5–B8 and B1–B4 (i.e., the data indicated by 7, 8, 9, 10, 11 and 12 indicated in FIG. 8E) are all latched in the registers 15-7, 15-8, and 15-1 to 15-4 by performing one sensing operation. Since successive column access from bank B8 to bank B1 is thus enabled, there will be no busy time. When output of the data from the banks B7, B8 and B1–B4 (i.e., the data indicated by 7, 8, 9, 10, 11 and 12 in FIG. 8F) comes to an end, and the next column in bank 5 is designated by the address, the address signals A3 et seq. are incremented, and signals CB, CBX, CC and CCX are changed thereby. Hence, access to the cell transistors corresponding to the next address (i.e., the cell transistors of the next columns of the banks B5–B8 and B1–B8) is started. As described above, even when upper-address bank B7 is selected, the sensing of data and the output of data are performed in parallel. By repeating a similar operation, a successive data read operation is performed in synchronism with clock /RE.

With the circuit configuration described above, even when an upper-address bank is designated by a read start address, there is no busy time during data output. Since successive access is thus enabled, the access cycle time can be as short as possible.

As described in the foregoing, a semiconductor memory device embodying the present invention enables successive data access even when an upper-address bank is designated by a read start address, and thus realizes a short access cycle time.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first and second memory cell arrays each of which has a plurality of banks and in which memory cells are arranged in a matrix pattern;
   a column address generation circuit, supplied with a read start address, for generating a column address having a plurality of bits, which sequentially counts up from the read start address;
   a bank selection circuit for selecting the banks on the basis of at least one bit more significant than a predetermined intervening bit of the column address generated by the column address generation circuit;
   a determination circuit for determining which memory cell array includes a bank of a designated memory cell;
   an address adder circuit, operating when the determination circuit determines that the second memory cell array includes the bank of the designated memory cell, for adding "1" to at least one bit not more significant than the predetermined intervening bit of the column address which is generated by the column address generation circuit and which are supplied to the first memory cell array;
   a first column selection circuit for selecting memory cell columns of the banks of the first memory cell array on the basis of at least one bit not more significant than the predetermined intervening bit of the column address generated by the column address generation circuit when the determination circuit determines that the first memory cell array includes the bank of the memory cell designated by the read start address, and for selecting memory cell columns of the banks of the first memory cell array on the basis of a "1"-incremented column address output from the address adder circuit when the determination circuit determines that the second memory cell array includes the bank of the memory cell designated by the read start address;
   a second column selection circuit for selecting memory cell columns of the banks of the second memory cell array on the basis of said at least one bit not significant than the predetermined intervening bit of the column address generated by the column address generation circuit;
   a sense amplifier circuit for amplifying data read out from the memory cells in units of one bank;
   a latch circuit for latching the data which are read out from the memory cells and which are amplified by the sense amplifier circuit in unit s of one bank; and
   an output circuit for sequentially outputting the data latched in the latch circuit, beginning with data corresponding to a bank selected by the bank selection circuit.

2. A semiconductor memory device according to claim 1, wherein said column address generation circuit includes a column counter in which the read start address is set as an initial value and which starts a sequential count-up operation.

3. A semiconductor memory device according to claim 1, wherein said bank selection circuit includes:
   a bank decoder for decoding at least one bit more significant than a predetermined intervening bit of the column address generated by the column address generation circuit; and
   a switch circuit, which is ON/OFF-controlled by an output signal from the bank decoder, for performing data transfer from the latch circuit to the output circuit in units of one bank.

4. A semiconductor memory device according to claim 1, wherein:
   said first column selection circuit includes:
      first decoder for decoding an output signal from the address adder circuit;
      a second decoder for decoding an output signal from the address adder circuit;
      a first column gate for selecting columns of the memory cell arrays in units of one bank on the basis of a decode signal output from the first decoder; and
      a second column gate for selecting the columns selected by the first column gate in units of one bank, on the basis of a decode signal output from the second decoder; and said second column selection circuit includes:

a third decoder for decoding a signal corresponding to a column address generated by the column address generation circuit;

a fourth decoder for decoding a signal corresponding to a column address generated by the column address generation circuit;

a third column gate for selecting columns of the memory cell arrays in units of one bank on the basis of a decode signal output from the third decoder; and a fourth column gate for selecting the columns selected by the third column gate in units of one bank, on the basis of a decode signal output from the fourth decoder.

5. A semiconductor memory device according to claim 1, wherein said determination circuit includes an address register for latching intermediate-bit data of the read start address, said intermediate-bit data being supplied from the address register to both the column address generation circuit and the column address adder circuit, for control.

6. A semiconductor memory device according to claim 1, wherein said column address generation circuit starts counting up the column address at a timing at which a data read operation for the first memory cell array is switched to a data read operation for the second memory cell array, when data is read out first from a memory cell included in the banks of the second memory cell array.

7. A semiconductor memory device according to claim 1, wherein said sense amplifier circuit includes a plurality of sense amplifiers, each of which is provided for one of the banks, respectively.

8. A semiconductor memory device according to claim 1, wherein said latch circuit includes a plurality of registers, each of which is provided for one of the banks, respectively.

9. A semiconductor memory device according to claim 1, wherein said output circuit includes an output buffer which is controlled based on an output enable signal.

10. A semiconductor memory device comprising:

first and second memory cell arrays each of which has a plurality of banks and in which memory cells are arranged in a matrix pattern;

a plurality of word lines, to which gates of transistors constituting the memory cells of the first and second memory cell arrays are connected such that the gates of the transistors of each row are connected to one of the word lines;

a first group of bit lines, to which drains of the transistors constituting the memory cells of the first memory cell array are connected such that the drains of the transistors of each column are connected to one of the bit lines of the first group;

a second group of bit lines, to which drains of the transistors constituting the memory cells of the second memory cell array are connected such that the drains of the transistors of each column are connected to one of the bit lines of the second group;

a source line to which sources of the transistors constituting the memory cells of the first and second memory cell arrays are connected;

a row decoder for selecting the word lines;

a first column gate connected to the bit lines of the first group;

a second column gate for selecting the first column gate;

a third column gate connected to the bit lines of the second group;

a fourth column gate for selecting the third column gate;

an address register for latching part of bits of a read start address, said address register being used for determining whether the read start address designates a bank of the first memory cell array or a bank of the second memory cell array;

a column counter in which the read start address is set and which generates a column address that is sequentially incremented in accordance with a count-up operation, said column counter being controlled on the basis of an output from the address register such that a timing at which at least one bit not more significant than a predetermined intervening bit of a generated column address are incremented is delayed when a bank of the second memory cell array is designated by the read start address;

an address adder, supplied with said at least one bit not more significant than the predetermined intervening bit of the column address output from the column counter, for adding "1" to the column address, thereby generating a "1"-incremented column address;

a first column decoder for selectively driving the first column gate, said first column decoder being supplied with said at least one bit not more significant than the predetermined intervening bit of the column address generated by the column counter when the address register determines that a bank in the first memory cell array is designated by the read start address, and being supplied with a "1"-incremented column address from the address adder when the address register determines that a bank in the second memory cell array is designated by the read start address;

a second column decoder for selectively driving the second column gate, said second column decoder being supplied with said at least one bit not more significant than the predetermined intervening bit of the column address generated by the column counter when the address register determines that the bank in the first memory cell array is designated by the read start address, and being supplied with the "1"-incremented column address from the address adder when the address register determines that the bank in the second memory cell array is designated by the read start address;

a third column decoder, supplied with a signal corresponding to said at least one bit not more significant than the predetermined intervening bit of the column address generated by the column counter, for selectively driving the third column gate;

a fourth column decoder, supplied with the signal corresponding to said at least one bit not more significant than the predetermined intervening bit of the column address generated by the column counter, for selectively driving the fourth column gate;

a sense amplifier for sensing and amplifying data which are read out from memory cells of a column selected by the first and second column gates and from memory cells of a column selected by the third and fourth column gates, said data being sensed and amplified in units of one bank;

a register for holding output data from the sense amplifier;

a fifth column gate for selecting the register so as to select a bank from which data is read out;

a bank decoder, supplied with at least one bit more significant than the predetermined intervening bit of the column address output from the column counter, for selectively driving the fifth column gate; and an output buffer for sequentially outputting data read out from the memory cells by way of the fifth column gate, such that data from a bank designated by the bank decoder is output first.

11. A semiconductor memory device comprising:

first and second memory cell arrays each including a plurality of banks, each of the banks including a plurality of columns;

a column address generation circuit, supplied with a read start address, for generating a column address which sequentially counts up from the read start address;

a bank selection circuit for selecting a bank that includes a column designated by the read start address, on the basis of the column address generated by the column address generation circuit;

a determination circuit for determining which memory cell array, the first or second memory cell array, includes a bank of a designated memory cell, on the basis of selection made by the bank selection circuit;

an address adder circuit, operating when the determination circuit determines that the second memory cell array includes the bank of the designated memory cell, for adding "1" to a column address to be supplied to the first memory cell array;

a first column selection circuit for selecting memory cell columns of the banks of the first memory cell array on the basis of the column address generated by the column address generation circuit when the determination circuit determines that the first memory cell array includes the bank of the memory cell designated by the read start address, and for selecting memory cell columns of the banks of the first memory cell array on the basis of a "1"-incremented column address output from the address adder circuit when the determination circuit determines that the second memory cell array includes the bank of the memory cell designated by the read start address;

a second column selection circuit for selecting memory cell columns of the banks of the second memory cell array on the basis of the column address generated by the column address generation circuit;

a sense amplifier circuit for amplifying data read out from the memory cells in units of one bank;

a latch circuit for latching data which are read out from the memory cells and which are amplified by the sense amplifier circuit in units of one bank; and an output circuit for sequentially outputting the data latched in the latch circuit, beginning with data corresponding to a bank selected by the bank selection circuit.

12. A semiconductor memory device comprising:

first and second memory cell array each of which has a plurality of banks and in which memory cells are arranged in a matrix pattern;

a column address generation circuit, supplied with a read start address, for generating a column address which sequentially counts up from the read start address;

a bank selection circuit for selecting a bank on the basis of a bit which is part of the column address generated by the column address generation circuit and which contains information indicating which of the banks is selected;

a determination circuit for determining which memory cell array, the first or second memory cell array, includes a bank of a memory cell designated by the read start address;

an address adder circuit, operating when the determination circuit determines that the second memory cell array includes the bank of the memory cell designated by the read start address, for adding "1" to a column address which is generated by the column address generation circuit and which is to be supplied to the first memory cell array;

a first column selection circuit for selecting memory cell columns of the banks of the first memory cell array on the basis of the column address generated by the column address generation circuit when the determination circuit determines that the first memory cell array includes the bank of the memory cell designated by the read start address, and for selecting memory cell columns of the banks of the first memory cell array on the basis of a "1"-incremented column address output from the address adder circuit when the determination circuit determines that the second memory cell array includes the bank of the memory cell designated by the read start address;

a second column selection circuit for selecting memory cell columns of the banks of the second memory cell array on the basis of the column address generated by the column address generation circuit;

a sense amplifier circuit for amplifying data read out from the memory cells in units of one bank;

a latch circuit for latching data which are read out from the memory cells and which are amplified by the sense amplifier circuit in units of one bank; and an output circuit for sequentially outputting the data latched in the latch circuit, beginning with data corresponding to a bank selected by the bank selection circuit.

13. A semiconductor memory device comprising:

memory cell arrays comprising a bank group having memory cells with addressees lower than a predetermined address, and a bank group having memory cells with addresses upper than the predetermined address, each of the bank groups being made of a plurality of banks, each of the banks including a plurality of columns;

a determination circuit for determining whether a read start address corresponds to the bank group having memory cells with addresses lower than the predetermined address, and said bank group having memory cells with addresses upper than the predetermined address;

an address adder circuit for providing the bank group having memory cells with addresses lower than the predetermined address with a "1"-incremented column address when the determination circuit determines that the read start address corresponds to the bank group having memory cells with addresses upper than the predetermined address; and a read control circuit for controlling the bank group having memory cells with addresses lower than the predetermined address to execute a data read operation with respect to a column that is next to a column corresponding to the read start address, on the basis of the "1"-incremented column address, and for controlling the bank group having memory cells with addresses upper than the predetermined address to execute a data read operation with respect to the column corresponding to the read start address.

* * * * *